(12) United States Patent
You et al.

(10) Patent No.: US 12,302,703 B2
(45) Date of Patent: May 13, 2025

(54) DISPLAY DEVICE AND METHOD OF MANUFACTURING DISPLAY DEVICE

(71) Applicant: Samsung Display Co., Ltd., Yongin-Si (KR)

(72) Inventors: Chungi You, Asan-si (KR); Sang-Ho Moon, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 654 days.

(21) Appl. No.: 17/512,926

(22) Filed: Oct. 28, 2021

(65) Prior Publication Data

US 2022/0190078 A1 Jun. 16, 2022

(30) Foreign Application Priority Data

Dec. 15, 2020 (KR) .................. 10-2020-0175877

(51) Int. Cl.
| | | |
|---|---|---|
| *H01L 21/00* | (2006.01) | |
| *H10K 50/80* | (2023.01) | |
| *H10K 59/121* | (2023.01) | |
| *H10K 59/131* | (2023.01) | |
| *H10K 71/00* | (2023.01) | |
| *H10K 59/12* | (2023.01) | |

(52) U.S. Cl.
CPC ......... *H10K 59/1213* (2023.02); *H10K 50/80* (2023.02); *H10K 59/1216* (2023.02); *H10K 59/131* (2023.02); *H10K 71/00* (2023.02); *H10K 59/1201* (2023.02)

(58) Field of Classification Search
CPC .. H10K 59/1213; H10K 59/131; H10K 50/80; H10K 71/00; H10K 59/1216; H10K 59/1201
See application file for complete search history.

(56) References Cited

U.S. PATENT DOCUMENTS

| | | | |
|---|---|---|---|
| 8,470,623 B2 * | 6/2013 | Kim | ................. H01L 21/02565 438/34 |
| 2018/0226459 A1 | 8/2018 | Bae et al. | |
| 2018/0249046 A1 | 8/2018 | Son et al. | |

FOREIGN PATENT DOCUMENTS

| | | |
|---|---|---|
| CN | 105185777 B | 2/2018 |
| KR | 1020080051828 A | 11/2013 |
| KR | 1020190067981 A | 6/2019 |

OTHER PUBLICATIONS

Extended European Search Report for Application No. 21214457.0-1020 dated May 24, 2022.

* cited by examiner

*Primary Examiner* — Richard A Booth
(74) *Attorney, Agent, or Firm* — CANTOR COLBURN LLP

(57) ABSTRACT

A method of manufacturing a display device may include forming an active pattern on a substrate, the active pattern including a first region, a second region spaced apart from the first region, and a third region disposed between the first region and the second region, forming an insulation layer on the active pattern, defining a first contact hole exposing a portion of the first region, a second contact hole exposing a portion of the second region, and an opening exposing the third region in the insulation layer, forming a conductive pattern filling the first and second contact holes on the insulation layer and removing the third region at a substantially same time, and forming a planarization layer on the conductive pattern.

8 Claims, 13 Drawing Sheets

110:111,112,113

DISPLAY DEVICE AND METHOD OF MANUFACTURING DISPLAY DEVICE

This application claims priority to Korean Patent Application No. 10-2020-0175877 filed on Dec. 15, 2020, and all the benefits accruing therefrom under 35 U.S.C. § 119, the content of which in its entirety is herein incorporated by reference.

BACKGROUND

1. Field

Embodiments relate to a display device. More particularly, embodiments relate to an organic light emitting display device and a method of manufacturing the organic light emitting display device.

2. Description of the Related Art

A display device may include a plurality of pixels that emit light for displaying an image. Each of the plurality of pixels may include a plurality of transistors for generating a driving current and a light emitting element for emitting light based on the driving current.

The plurality of transistors of each of the pixels may include an active pattern including a semiconductor material.

SUMMARY

When an active pattern includes regions electrically separated from each other, the active pattern may be damaged by static electricity introduced in a process of manufacturing or using a display device.

Embodiments provide a method of manufacturing a display device for preventing the display device from being damaged in a manufacturing process.

Embodiments provide a display device having an improved display quality.

A method of manufacturing a display device in an embodiment may include forming an active pattern on a substrate, the active pattern including a first region, a second region spaced apart from the first region, and a third region disposed between the first region and the second region, forming an insulation layer on the active pattern, defining a first contact hole exposing a portion of the first region, a second contact hole exposing a portion of the second region, and an opening exposing the third region in the insulation layer, forming a conductive pattern filling the first and second contact holes on the insulation layer and removing the third region at a substantially same time, and forming a planarization layer on the conductive pattern.

In an embodiment, the forming the conductive pattern and removing the third region at the substantially same time may include forming a conductive layer filling the first and second contact holes and the opening on the insulation layer and etching a portion of the conductive layer filling the opening and the third region.

In an embodiment, the planarization layer may contact a surface of the first region and a surface of the second region which face each other.

In an embodiment, the method may further include forming a buffer layer on the substrate before forming the active pattern.

In an embodiment, the planarization layer may contact the buffer layer.

In an embodiment, the forming the conductive pattern and removing the third region at the substantially same time may include partially etching a portion of the buffer layer overlapping the third region.

In an embodiment, the first contact hole, the second contact hole, and the opening may be defined at a substantially same time.

In an embodiment, the first region and the second region may be physically separated from each other after the forming the conductive pattern and removing the third region at a substantially same time.

In an embodiment, the insulation layer may include a gate insulation layer, a first insulation interlayer, and a second insulation interlayer that are sequentially stacked on the active pattern.

A display device in an embodiment may include an active pattern which is disposed on a substrate and includes a first region and a second region spaced apart from the first region, an insulation layer which is disposed on the active pattern and in which a first contact hole and a second contact hole respectively exposing a portion of the first region and a portion of the second region are defined, a conductive pattern which is disposed on the insulation layer and contacts the first region and the second region through the first contact hole and the second contact hole, respectively, and a planarization layer which is disposed on the conductive pattern and contacts a surface of the first region and a surface of the second region which face each other.

In an embodiment, the display device may further include a buffer layer disposed between the substrate and the active pattern.

In an embodiment, an opening overlapping a portion between the first region and the second region may be defined in the insulation layer.

In an embodiment, the planarization layer may contact the buffer layer through the opening.

In an embodiment, the buffer layer may have a trench overlapping a portion between the first region and the second region.

In an embodiment, the display device may further include a driving transistor which generates a driving current, a light emitting diode which emits a light based on the driving current, a first initialization transistor which provides a first initialization voltage to a gate electrode of the driving transistor, and a second initialization transistor which provides a second initialization voltage different from the first initialization voltage to an anode electrode of the light emitting diode.

In an embodiment, the first region may be a source electrode of the first initialization transistor, and the second region may be a source electrode of the second initialization transistor.

In an embodiment, the display device may further include a first initialization voltage line which transmits the first initialization voltage and is electrically connected to the first region and a second initialization voltage line which transmits the second initialization voltage and is electrically connected to the second region.

In an embodiment, the display device may further include a driving transistor which generates a driving current, a storage capacitor including a first electrode connected to a gate electrode of the driving transistor and a second electrode overlapping the first electrode, a light emitting diode which emits a light based on the driving current, an initialization transistor which provides an initialization voltage to the first electrode of the storage capacitor, and a reference transistor which provides a reference voltage to the second electrode of the storage capacitor.

In an embodiment, the first region may be a drain electrode of the initialization transistor, and the second region may be a drain electrode of the reference transistor.

In an embodiment, the display device may further include an initialization voltage line which transmits the initialization voltage and is electrically connected to the first region and a reference voltage line which transmits the reference voltage and is electrically connected to the second region.

In the method of manufacturing the display device in the embodiments, the conductive pattern connected to the first region and the second region of the active pattern may be provided at a substantially same time as removing the third region of the active pattern, so that, although static electricity is introduced in a manufacturing process of the display device, the static electricity may be dispersed and the active pattern may not be damaged.

In the display device in the embodiments, the first region and the second region of the active pattern, which are spaced apart from each other, may be connected to the conductive pattern, so that, although static electricity is introduced in a manufacturing process or a using process of the display device, the static electricity may be dispersed and the active pattern may not be damaged. Accordingly, the display quality of the display device may be improved.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Figure 1:
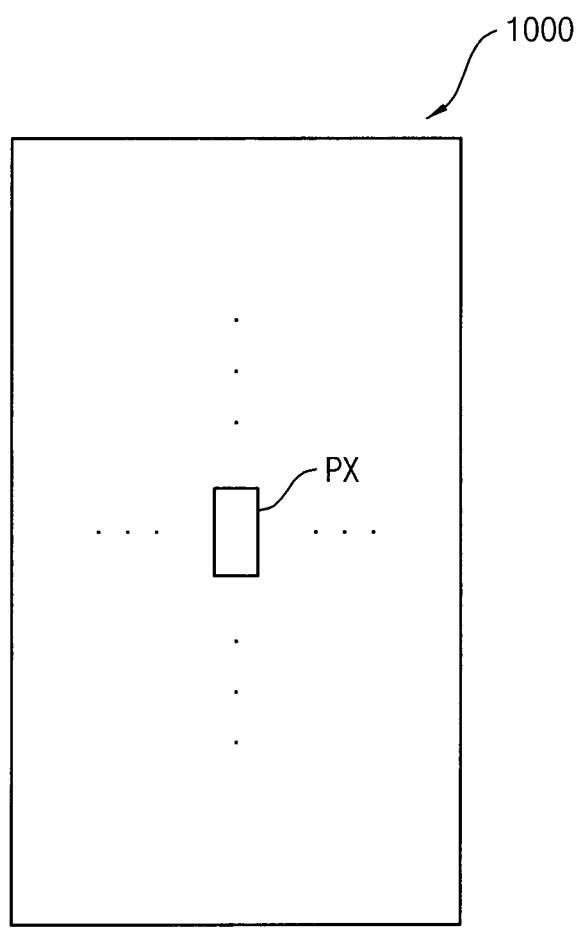
FIG. 1 is a plan view illustrating a display device.
Figure 1:
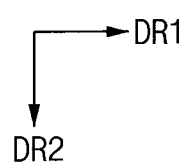

Hereinafter, display devices and methods of manufacturing display devices in embodiments will be explained in detail with reference to the accompanying drawings.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein. Also, when elements are described as being "the same" or "substantially the same", the degree of sameness may be satisfactory to those having ordinary knowledge.

Hereinafter, a display device in an embodiment will be described with reference to FIGS. 1 to 4.

FIG. 1 is a plan view illustrating an embodiment of a display device.

Referring to FIG. 1, a display device 1000 may include a plurality of pixels PX. The pixels PX may be arranged in a matrix form along a first direction DR1 and a second direction DR2 crossing the first direction DR1. However, the invention is not limited thereto, and the plurality of pixels PX may be arranged in various other forms. Each of the pixels PX may emit light, and the display device 1000 may display an image based on the light.

Figure 2:
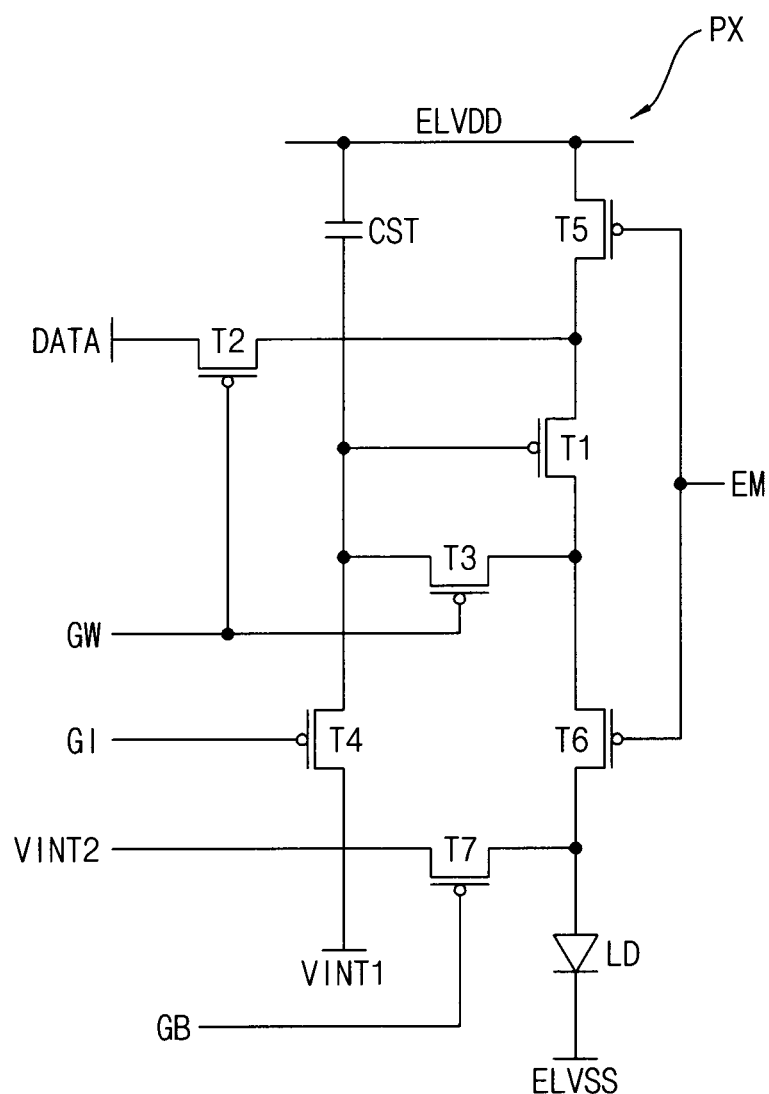
FIG. 2 is a circuit diagram illustrating a pixel.

FIG. 2 is a circuit diagram illustrating an embodiment of a pixel. In an embodiment, FIG. 2 may illustrate an embodiment of the pixel PX of the display device 1000 in FIG. 1, for example.

Referring to FIG. 2, the pixel PX may include a plurality of transistors T1, T2, T3, T4, T5, T6, and T7, a storage capacitor CST, and a light emitting diode LD. The transistors T1, T2, T3, T4, T5, T6, and T7 may include a first transistor T1, a second transistor T2, a third transistor T3, a fourth transistor T4, a fifth transistor. T5, a sixth transistor T6, and a seventh transistor T7.

The first transistor T1 may be electrically connected to a first power voltage line ELVDD and an anode electrode of the light emitting diode LD, and may transmit a driving current corresponding to a data signal provided by a data line DATA to the light emitting diode LD. In other words, the first transistor T1 may be a driving transistor.

The second transistor T2 may be connected between the data line DATA and a first electrode of the first transistor T1, and may transmit the data signal to the first transistor T1 in response to a scan signal provided by a scan line GW. In other words, the second transistor T2 may be a switching transistor.

The third transistor T3 may be connected between a gate electrode of the first transistor T1 and a second electrode of the first transistor T1, and may diode-connect the first transistor T1 in response to the scan signal thereby compensating a threshold voltage of the first transistor T1. In other words, the third transistor T3 may be a compensation transistor.

The fourth transistor T4 may be connected between a first initialization voltage line VINT1 and the gate electrode of the first transistor T1, and may provide a first initialization voltage provided by the first initialization voltage line VINT1 to the gate electrode of the first transistor T1 in response to a first initialization control signal provided by a first initialization control line GI. In other words, the fourth transistor T4 may be a driving initialization transistor.

The fifth transistor T5 may be connected between the first power voltage line ELVDD and the first electrode of the first transistor T1, and the sixth transistor T6 may be connected between the second electrode of the first transistor T1 and the anode electrode of the light emitting diode LD. Each of the fifth transistor T5 and the sixth transistor T6 may provide the driving current to the anode electrode of the light emitting diode LD in response to an emission control signal provided by an emission control line EM. In other words, each of the fifth transistor T5 and the sixth transistor T6 may be an emission control transistor.

The seventh transistor T7 may be connected between a second initialization voltage line VINT2 and the anode electrode of the light emitting diode LD, and may provide a second initialization voltage provided by the second initialization voltage line VINT2 to the anode electrode of the light emitting diode LD in response to a second initialization control signal provided by a second initialization control line GB. In other words, the seventh transistor T7 may be a diode initialization transistor. A voltage level of the second initialization voltage may be different from a voltage level of the first initialization voltage. In an embodiment, the voltage level of the second initialization voltage may be lower than the voltage level of the first initialization voltage.

In an embodiment, a first electrode and a second electrode of each of the transistors T1, T2, T3, T4, T5, T6, and T7 may be a source electrode and a drain electrode, respectively. However, the invention is not limited thereto, and the first electrode and the second electrode of each of the transistors T1, T2, T3, T4, T5, T6, and T7 may be the drain electrode and the source electrode, respectively.

The storage capacitor CST may be connected between the first power voltage line ELVDD and the gate electrode of the first transistor T1. The storage capacitor CST may maintain a voltage between the first power voltage line ELVDD and the gate electrode of the first transistor T1.

The light emitting diode LD may be connected between the second electrode of the sixth transistor T6 and a second power voltage line ELVSS. The light emitting diode LD may emit light based on the driving current.

In the illustrated embodiment, the first initialization voltage line VINT1 providing the first initialization voltage applied to the fourth transistor T4 and the second initialization voltage line VINT2 providing the second initialization voltage applied to the seventh transistor T7 may be separated from each other, so that the first transistor T1 and the light emitting diode LD may be initialized by different voltages. Accordingly, when the pixel PX is driven in a low grayscale, low grayscale stains of the display device may be improved.

Figure 3:
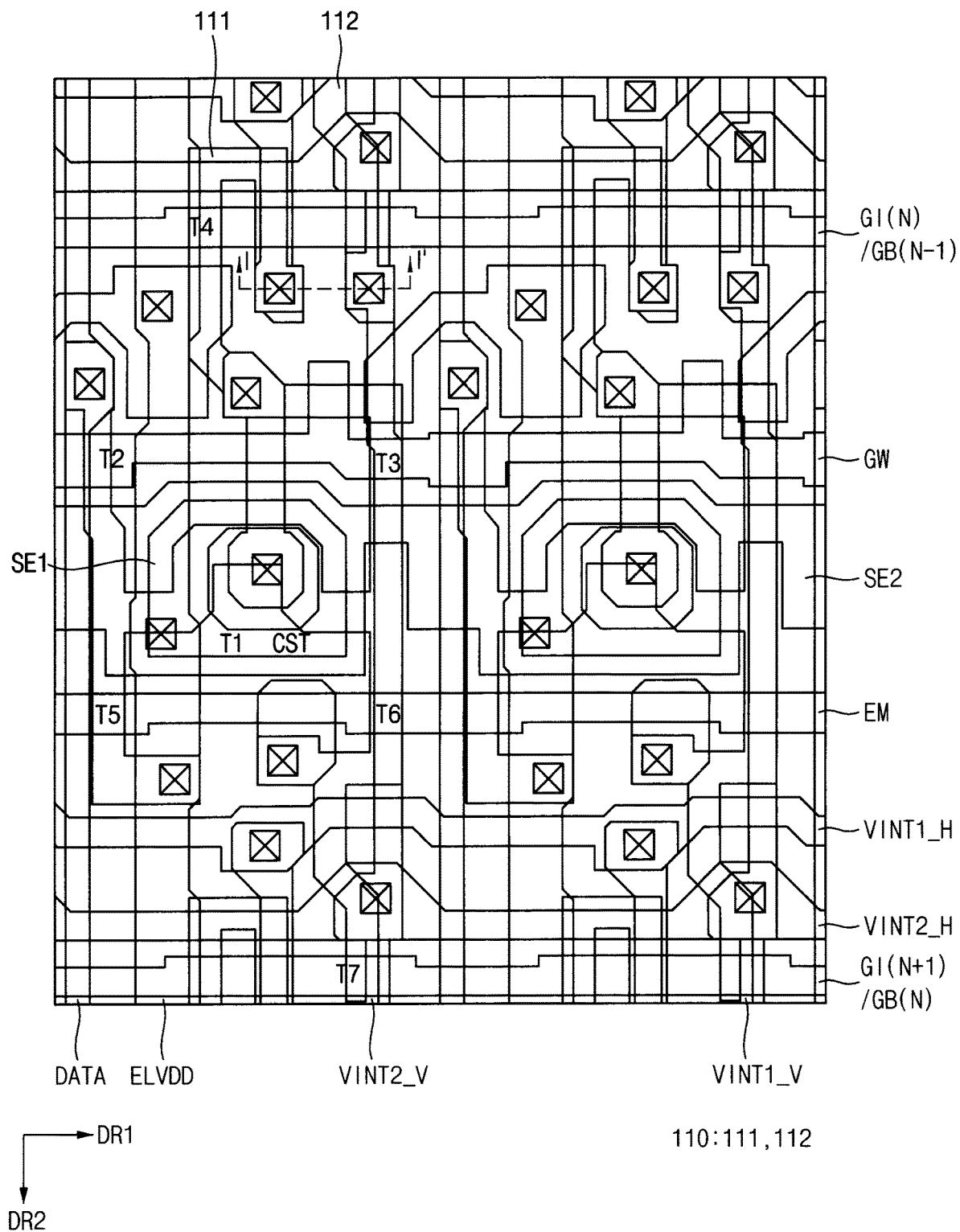
FIG. 3 is a plan view illustrating the pixel in FIG. 2.
Figure 4:
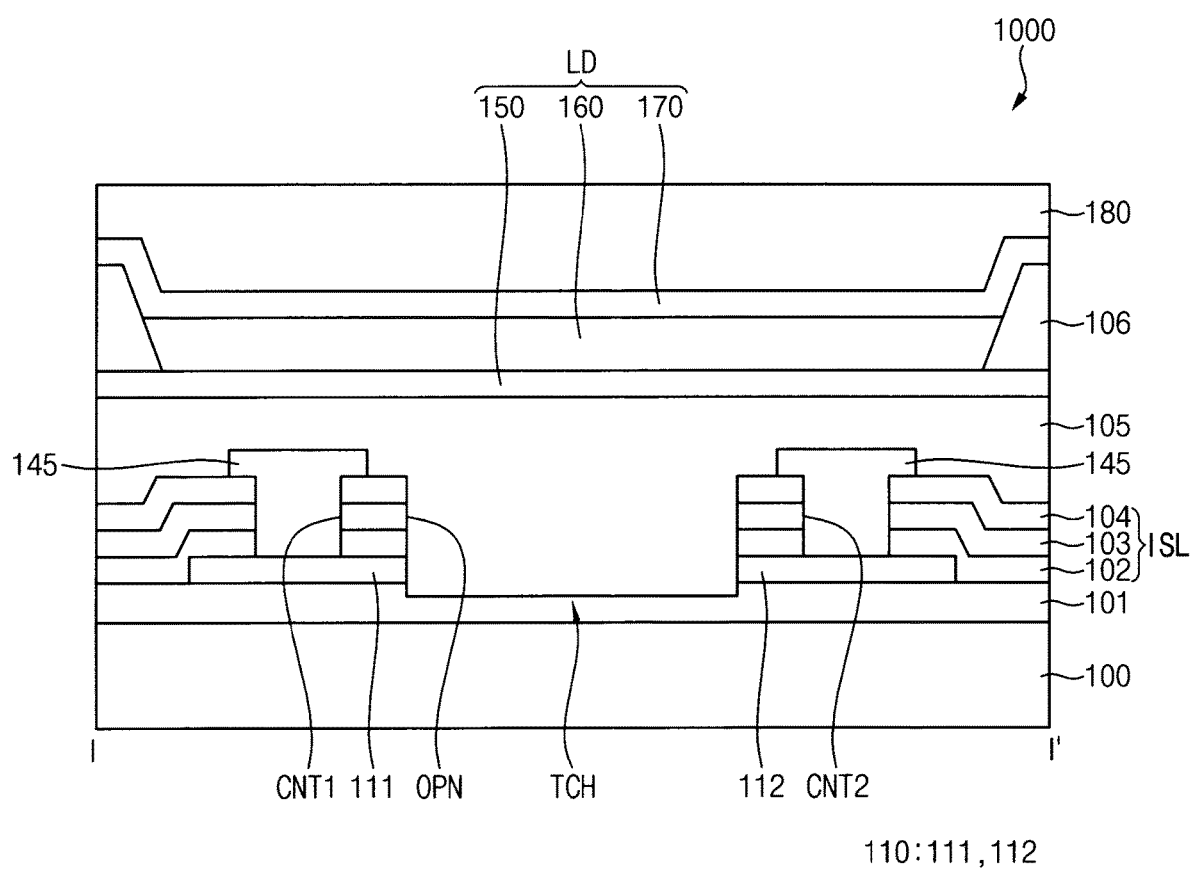
FIG. 4 is a cross-sectional view illustrating a display device taken along line I-I' in FIG. 3.

FIG. 3 is a plan view illustrating the pixel PX in FIG. 2. FIG. 4 is a cross-sectional view illustrating the display device 1000 taken along line I-I' in FIG. 3.

Referring to FIGS. 2, 3, and 4, the display device 1000 may include a substrate 100, a buffer layer 101, an active pattern 110, a gate insulation layer 102, a first conductive pattern, a first insulation interlayer 103, a second conductive pattern, a second insulation interlayer 104, a third conductive pattern 145, a planarization layer 105, a first electrode 150, a pixel defining layer 106, an emission layer 160, a second electrode 170, and an encapsulation layer 180.

The substrate 100 may include a transparent or opaque material. In an embodiment, the substrate 100 may include a quartz substrate, a synthetic quartz substrate, a calcium fluoride substrate, a fluorine-doped quartz substrate, a sodalime glass substrate, a non-alkali substrate, or the like, for example. In an alternative embodiment, the substrate 100 may include a flexible transparent resin substrate. In an embodiment, the transparent resin substrate may be a polyimide substrate, for example.

The buffer layer 101 may be disposed on the substrate 100. The buffer layer 101 may prevent diffusion of metal atoms or impurities from the substrate 100 to the active pattern 110. Further, the buffer layer 101 may control a heat transfer rate in a crystallization process for forming the active pattern 110 to obtain a uniform active pattern 110 or a substantially uniform active pattern 110.

The active pattern 110 may be disposed on the buffer layer 101. In an embodiment, the active pattern 110 may include polycrystalline silicon. In another embodiment, the active pattern 110 may include an oxide semiconductor. In an embodiment, the oxide semiconductor may include an oxide of at least one of indium (In), gallium (Ga), tin (Sn), zirconium (Zr), vanadium (V), hafnium (Hf), cadmium (Cd), germanium (Ge), chromium (Cr), titanium (Ti), and zinc (Zn), for example.

The active pattern 110 may include a first region 111 and a second region 112. The second region 112 may be spaced apart from the first region 111. In other words, the first region 111 and the second region 112 may be physically separated from each other.

In an embodiment, the first region 111 may be a source electrode of the fourth transistor T4, and the second region 112 may be a source electrode of the seventh transistor T7. In an embodiment, the fourth transistor T4 may be included in a pixel in an N-th row, and the seventh transistor T7 may be included in a pixel in an (N−1)-th row where N is a natural number equal to or greater than 2, for example. However, the invention is not limited thereto, and in another embodiment, the first region 111 may be a drain electrode of the fourth transistor T4, and the second region 112 may be a drain electrode of the seventh transistor T7.

A trench TCH overlapping a portion between the first region 111 and the second region 112 of the active pattern 110 may be defined in the buffer layer 101. The trench TCH may have a cross-sectional shape recessed from an upper surface of the buffer layer 101 toward a lower surface of the buffer layer 101.

The gate insulation layer 102 may be disposed on the active pattern 110. The gate insulation layer 102 may cover the active pattern 110 on the buffer layer 101, and may have a constant thickness along the profile of the active pattern 110 or a substantially constant thickness along the profile of the active pattern 110. In an embodiment, the gate insulation layer 102 may include a silicon compound, a metal oxide, or the like.

The first conductive pattern may be disposed on the gate insulation layer 102. The first conductive pattern may include the scan line GW, the initialization control line GI(N)/GB(N-1), the emission control line EM, and a first storage electrode SE1. In an embodiment, the first conductive pattern may include or consist of a metal, an alloy, a metal nitride, a conductive metal oxide, a transparent conductive material, or the like, for example.

The scan line GW may extend in the first direction DR1. The active pattern 110 may form the second transistor T2 and the third transistor T3 together with the scan line GW. The initialization control line GI(N)/GB(N-1) may extend in the first direction DR1. The active pattern 110 may form the fourth transistor T4 included in the pixel in the N-th row and the seventh transistor T7 included in the pixel in the (N-1)-th row together with the initialization control line GI(N)/GB(N-1). A subsequent initialization control line GI(N+1)/GB(N) may be disposed below the initialization control line GI(N)/GB(N-1) and extend in the first direction DR1.

The emission control line EM may extend in the first direction DR1. The active pattern 110 may form the fifth transistor T5 and the sixth transistor T6 together with the emission control line EM. The first storage electrode SE1 may be disposed between the scan line GW and the emission control line EM. The active pattern 110 may form the first transistor T1 together with the first storage electrode SE1.

The first insulation interlayer 103 may be disposed on the first conductive pattern. The first insulation interlayer 103 may cover the first conductive pattern on the gate insulation layer 102, and may have a constant thickness or a substantially constant thickness along the profile of the first conductive pattern. In an embodiment, the first insulation interlayer 103 may include a silicon compound, a metal oxide, or the like, for example.

The second conductive pattern may be disposed on the first insulation interlayer 103. The second conductive pattern may include a first horizontal initialization voltage line VINT1_H, a second horizontal initialization voltage line VINT2_H, and a second storage electrode SE2. In an embodiment, the second conductive pattern may include or consist of a metal, an alloy, a metal nitride, a conductive metal oxide, a transparent conductive material, or the like.

The first horizontal initialization voltage line VINT1_H may extend in the first direction DR1. The second horizontal initialization voltage line VINT2_H may extend in the first direction DR1. The second storage electrode SE2 may extend in the first direction DR1. The second storage electrode SE2 may overlap the first storage electrode SE1, and may form the storage capacitor CST together with the first storage electrode SE1. The first power voltage transmitted from the first power voltage line ELVDD may be applied to the second storage electrode SE2.

The second insulation interlayer 104 may be disposed on the second conductive pattern. In an embodiment, the second insulation interlayer 104 may cover the second conductive pattern on the first insulation interlayer 103, and may have a constant thickness or a substantially constant thickness along the profile of the second conductive pattern. In another embodiment, the second insulation interlayer 104 may sufficiently cover the second conductive pattern on the first insulation interlayer 103, and may have a flat upper surface or a substantially flat upper surface without generating a step around the second conductive pattern. The second insulation interlayer 104 may include or consist of an inorganic insulation material or an organic insulation material.

The gate insulation layer 102, the first insulation interlayer 103, and the second insulation interlayer 104 may form an insulation layer ISL. In other words, the insulation layer ISL may include the gate insulation layer 102, the first insulation interlayer 103, and the second insulation interlayer 104 that are sequentially stacked on the active pattern 110.

A first contact hole CNT1, a second contact hole CNT2, and an opening OPN may be defined in the insulation layer ISL. The first contact hole CNT1 may expose a portion of the first region 111 of the active pattern 110, and the second contact hole CNT2 may expose a portion of the second region 112 of the active pattern 110.

The opening OPN may overlap a portion between the first region 111 and the second region 112 of the active pattern 110. In this case, the opening OPN may overlap the trench TCH.

The third conductive pattern 145 may be disposed on the second insulation interlayer 104. The third conductive pattern 145 may include the data line DATA, the first power voltage line ELVDD, a first vertical initialization voltage line VINT1_V, and a second vertical initialization voltage line VINT2_V. In an embodiment, the third conductive pattern 145 may include or consist of a metal, an alloy, a metal nitride, a conductive metal oxide, a transparent conductive material, or the like.

The data line DATA may extend in the second direction DR2. The data line DATA may be electrically connected to the active pattern 110 through a contact hole defined in the second insulation interlayer 104, the first insulation interlayer 103, and the gate insulation layer 102.

The first power voltage line ELVDD may extend in the second direction DR2. The first power voltage line ELVDD may be electrically connected to the active pattern 110 through a contact hole defined in the second insulation interlayer 104, the first insulation interlayer 103, and the gate insulation layer 102, and may be electrically connected to the second storage electrode SE2 through a contact hole defined in the second insulation interlayer 104.

The first vertical initialization voltage line VINT1_V may extend in the second direction DR2. The first vertical initialization voltage line VINT1_V may be electrically connected to the first horizontal initialization voltage line VINT1_H through a contact hole defined in the second insulation interlayer 104. The first horizontal initialization voltage line VINT1_H and the first vertical initialization voltage line VINT1_V may form the first initialization voltage line VINT1.

The second vertical initialization voltage line VINT2_V may extend in the second direction DR2. The second vertical initialization voltage line VINT2_V may be electrically connected to the second horizontal initialization voltage line VINT2_H through a contact hole defined in the second insulation interlayer 104. The second horizontal initialization voltage line VINT2_H and the second vertical initialization voltage line VINT2_V may form the second initialization voltage line VINT2.

The third conductive pattern 145 may contact the first region 111 and the second region 112 through the first contact hole CNT1 and the second contact hole CNT2, respectively. In this case, each of the first region 111 and the second region 112 of the active pattern 110 may be electrically connected to other elements of the display device 1000. In an embodiment, the first region 111 of the active pattern 110 may be electrically connected to the first initialization voltage line VINT1, and the second region 112 of the active pattern 110 may be electrically connected the second initialization voltage line VINT2.

The planarization layer 105 may be disposed on the third conductive pattern 145. The planarization layer 105 may sufficiently cover the third conductive pattern 145 on the second insulation interlayer 104, and may have a flat upper surface or a substantially flat upper surface without generating a step around the third conductive pattern 145. In an embodiment, the planarization layer 105 may include or consist of an organic insulation material such as a photoresist, an acrylic resin, a polyimide resin, a polyamide resin, a siloxane-based resin, or the like.

The planarization layer 105 may contact a side surface of the first region 111 and a side surface of the second region 112. As the first region 111 and the second region 112 are spaced apart from each other and the opening OPN of the insulation layer ISL overlaps the portion between the first region 111 and the second region 112, the planarization layer 105 may contact the side surface of the first region 111 and the side surface of the second region 112.

In an embodiment, the planarization layer 105 may contact the buffer layer 101 through the opening OPN of the insulation layer ISL. The planarization layer 105 may fill the opening OPN of the insulation layer ISL and the trench TCH of the buffer layer 101.

The first electrode 150 may be disposed on the planarization layer 105. Depending on how the display device 1000 emits light, the first electrode 150 may include or consist of a reflective material or a transmitting material. In an embodiment, the first electrode 150 may include aluminum (Al), an alloy including at least one of aluminum (Al), aluminum nitride ($AlN_x$), and silver (Ag), an alloy including at least one of silver (Ag), tungsten (W), tungsten nitride ($WN_x$), and copper (Cu), an alloy including at least one of copper (Cu), nickel (Ni), chromium (Cr), chromium nitride ($CrN_x$), and molybdenum (Mo), an alloy including at least one of molybdenum (Mo), titanium (Ti), titanium nitride ($TiN_x$), platinum (Pt), tantalum (Ta), tantalum nitride ($TaN_x$), neodymium (Nd), scandium (Sc), zinc oxide ($ZnO_x$), indium tin oxide ("ITO"), tin oxide ($SnO_x$), indium oxide ($InO_x$), gallium oxide ($GaO_x$), and indium zinc oxide ("IZO"), or the like. In an embodiment, the first electrode 150 may be formed or provided as a single-layer structure or a multilayer structure including a metal layer, an alloy layer, a metal nitride layer, a conductive metal oxide layer, and/or a transparent conductive oxide layer, for example.

The pixel defining layer 106 may be disposed on the first electrode 150. The pixel defining layer 106 may include or consist of an organic insulation material, an inorganic insulation material, or the like. In an embodiment, the pixel defining layer 106 may include or consist of a photoresist, a polyacrylic resin, a polyimide resin, an acrylic resin, a silicone compound, or the like. In an embodiment, an opening partially exposing the first electrode 150 may be defined in the pixel defining layer 106, for example. An emission area and a non-emission area of the display device 1000 may be defined by the opening of the pixel defining layer 106. In an embodiment, the emission area may correspond to a portion of the pixel defining layer 106 in which the opening is defined, and the non-emission area may correspond to a portion of the pixel defining layer 106 adjacent to the opening, for example.

The emission layer 160 may be disposed on the first electrode 150 exposed through the opening of the pixel defining layer 106. Further, the emission layer 160 may extend on a sidewall of the opening of the pixel defining layer 106. In an embodiment, the emission layer 160 may have a multilayer structure including an organic emission layer, a hole injection layer, a hole transport layer, an electron transport layer, an electron injection layer, of the like.

The second electrode 170 may be disposed on the pixel defining layer 106 and the emission layer 160. Depending on how the display device 1000 emits light, the second electrode 170 may include or consist of a transmitting material or a reflective material. In an embodiment, the second electrode 170 may include aluminum (Al), an alloy including at least one of aluminum (Al), aluminum nitride ($AlN_x$), and silver (Ag), an alloy including at least one of silver (Ag), tungsten (W), tungsten nitride ($WN_x$), and copper (Cu), an alloy including at least one of copper (Cu), nickel (Ni), chromium (Cr), chromium nitride ($CrN_x$), and molybdenum (Mo), an alloy including at least one of molybdenum (Mo), titanium (Ti), titanium nitride ($TiN_x$), platinum (Pt), tantalum (Ta), tantalum nitride ($TaN_x$), neodymium (Nd), scandium (Sc), zinc oxide ($ZnO_x$), ITO, tin oxide ($SnO_x$), indium oxide ($InO_x$), gallium oxide ($GaO_x$), and IZO, or the like, for example. In an embodiment, the second electrode 170 may be formed or provided as a single-layer structure or a multilayer structure including a metal layer, an alloy layer, a metal nitride layer, a conductive metal oxide layer, and/or a transparent conductive oxide layer.

The first electrode 150, the emission layer 160, and the second electrode 170 may form the light emitting diode LD. In an embodiment, the first electrode 150 and the second electrode 170 may be an anode electrode and a cathode electrode of the light emitting diode LD, respectively. However, the invention is not limited thereto, and in another embodiment, the first electrode 150 and the second electrode 170 may be the cathode electrode and the anode electrode of the light emitting diode LD, respectively.

The encapsulation layer 180 may be disposed on the second electrode 170. The encapsulation layer 180 may prevent penetration of external moisture and oxygen. The encapsulation layer 180 may include at least one inorganic encapsulation layer and at least one organic encapsulation layer. At least one inorganic encapsulation layer and at least one organic encapsulation layer may be alternately stacked with each other.

In an embodiment, the encapsulation layer 180 may include a first inorganic encapsulation layer, an organic encapsulation layer, and a second inorganic encapsulation layer. The first inorganic encapsulation layer, the organic encapsulation layer, and the second inorganic encapsulation layer may be sequentially stacked on the second electrode 170.

Hereinafter, a method of manufacturing a display device in an embodiment will be described with reference to FIGS. 5 to 13.

FIGS. 5, 6, 7, 8, 9, 10, 11, 12, and 13 are diagrams illustrating an embodiment of a method of manufacturing a display device. In an embodiment, FIGS. 5 to 13 may illustrate a method of manufacturing the display device 1000 in FIGS. 3 and 4.

Figure 5:
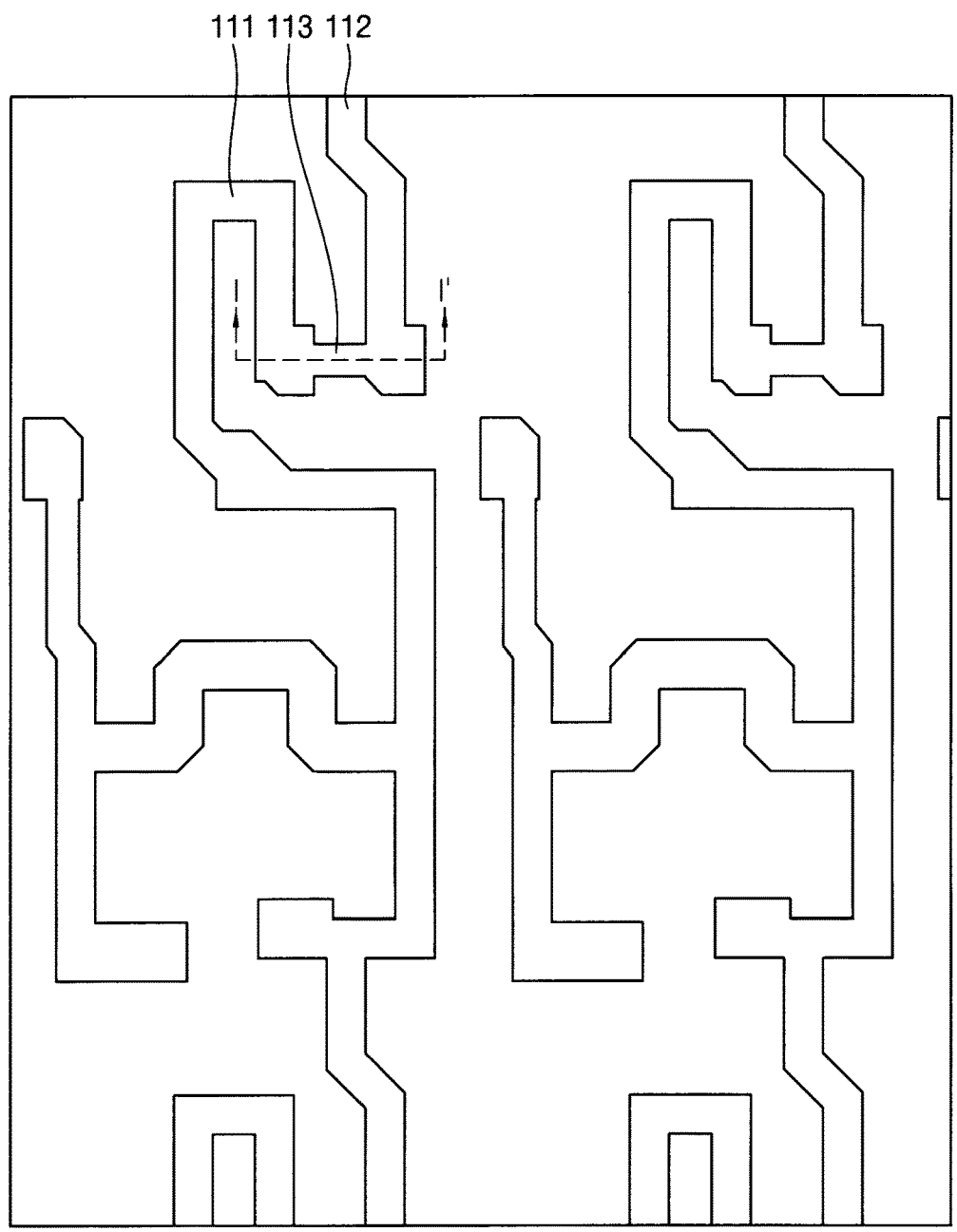
FIGS. 5, 6, 7, 8, 9, 10, 11, 12, and 13 are diagrams illustrating a method of manufacturing a display device.
Figure 6:
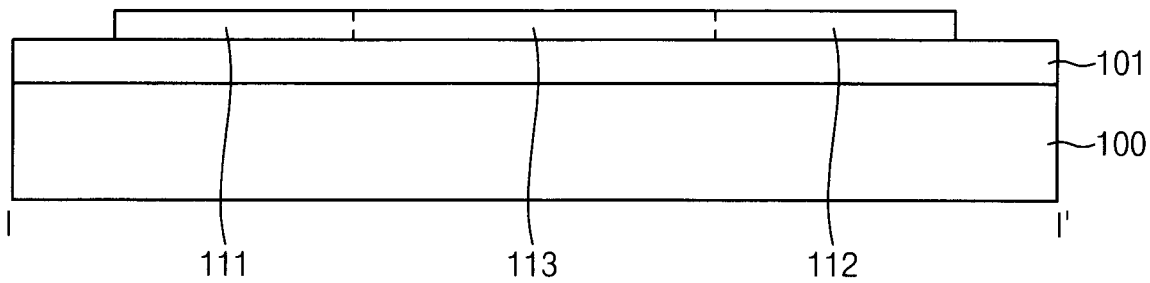

Referring to FIGS. 5 and 6, a buffer layer 101 and an active pattern 110 may be formed or disposed on a substrate 100.

First, the buffer layer 101 may be formed or disposed on the substrate 100. In an embodiment, the buffer layer 101 may include or consist of a silicon compound, a metal oxide, or the like, for example.

Then, the active pattern 110 may be formed or disposed on the buffer layer 101. In an embodiment, an active layer may be formed or disposed on the buffer layer 101 using polycrystalline silicon or an oxide semiconductor, and the active layer may be patterned to form the active pattern 110, for example.

The active pattern 110 may include a first region 111, a second region 112, and a third region 113. The second region 112 may be spaced apart from the first region 111. The third region 113 may be positioned between the first region 111 and the second region 112.

Figure 7:
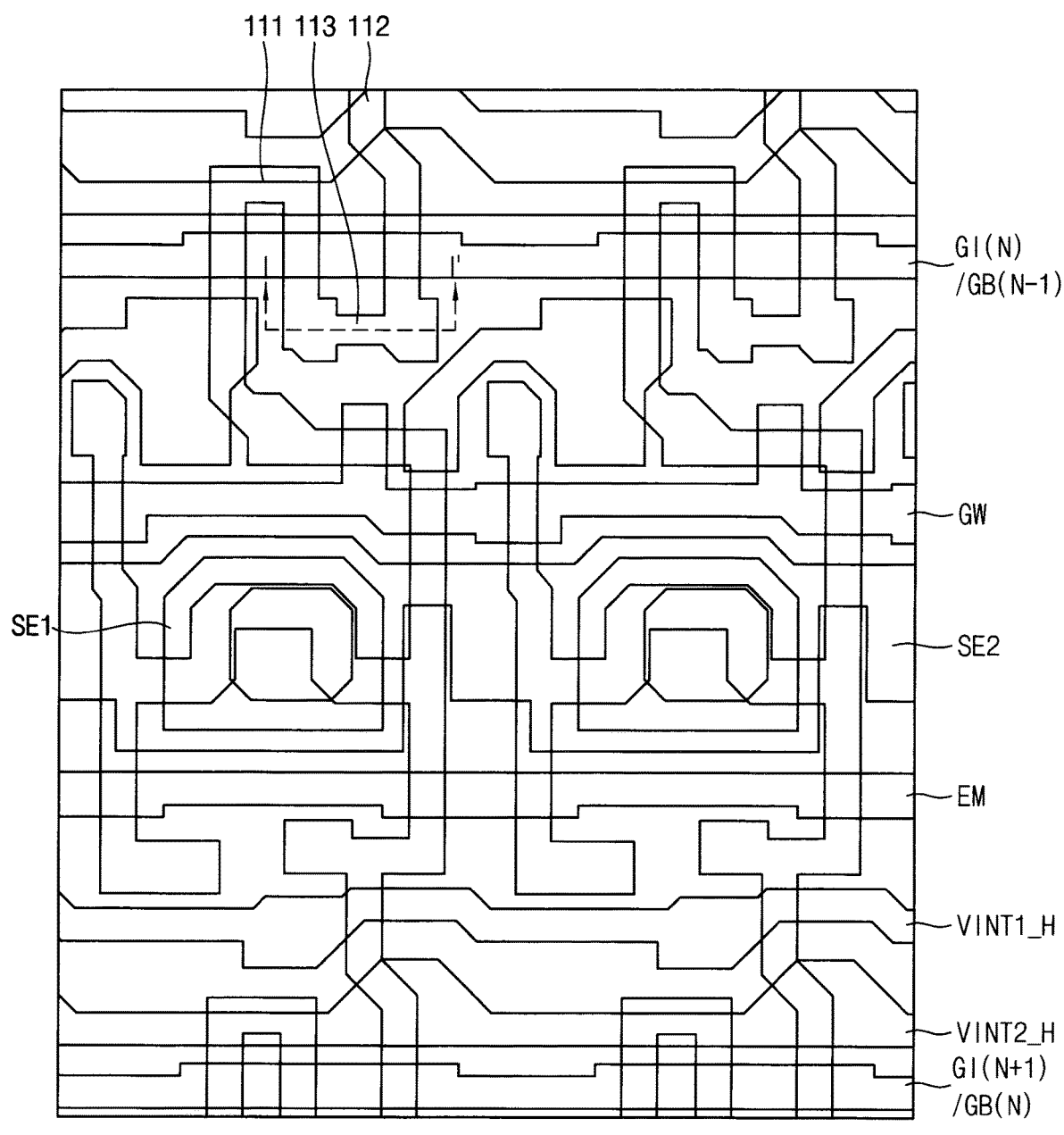
Figure 8:
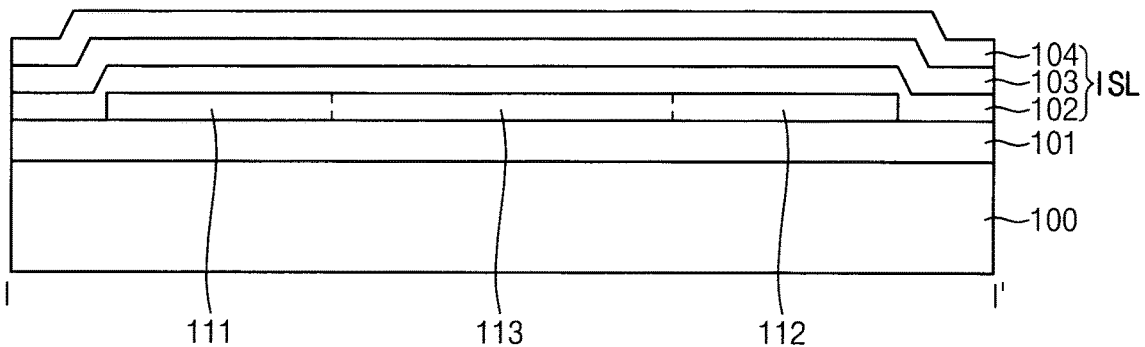

Referring to FIGS. 7 and 8, an insulation layer ISL may be formed or disposed on the active pattern 110. A gate insulation layer 102, a first conductive pattern, a first insulation interlayer 103, a second conductive pattern, and a second insulation interlayer 104 may be sequentially formed or disposed on the active pattern 110. The insulation layer ISL may include the gate insulation layer 102, the first insulation interlayer 103, and the second insulation interlayer 104 that are sequentially stacked on the active pattern 110.

Figure 9:
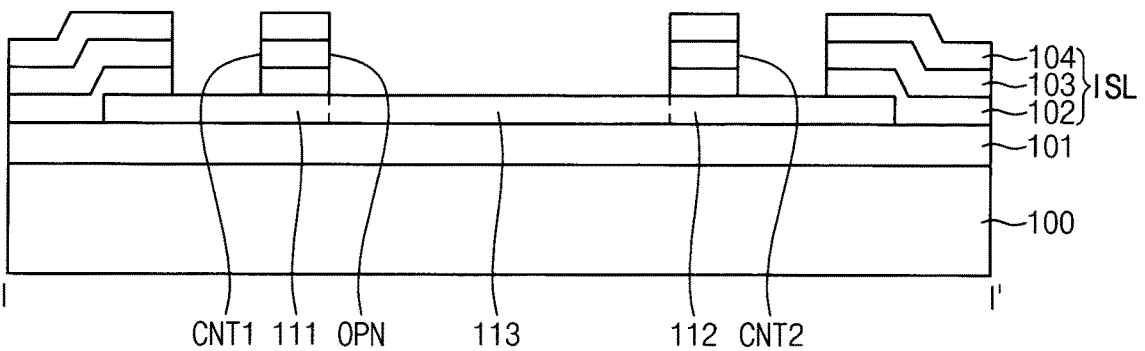

Referring to FIG. 9, a first contact hole CNT1, a second contact hole CNT2, and an opening OPN may be defined in the insulation layer ISL. The first contact hole CNT1 may expose a portion of the first region 111 of the active pattern 110, and the second contact hole CNT2 may expose a portion of the second region 112 of the active pattern 110. The opening OPN may expose the third region 113 of the active pattern 110.

In an embodiment, the first contact hole CNT1, the second contact hole CNT2, and the opening OPN may be defined in a simultaneous manner or a substantially simultaneous manner. That is, the first contact hole CNT1, the second contact hole CNT2, and the opening OPN may be defined at a same time or a substantially same time. In an embodiment, the first contact hole CNT1, the second contact hole CNT2, and the opening OPN may be defined at a same time or a substantially same time through single photolithography process using single photo mask, for example.

Figure 10:
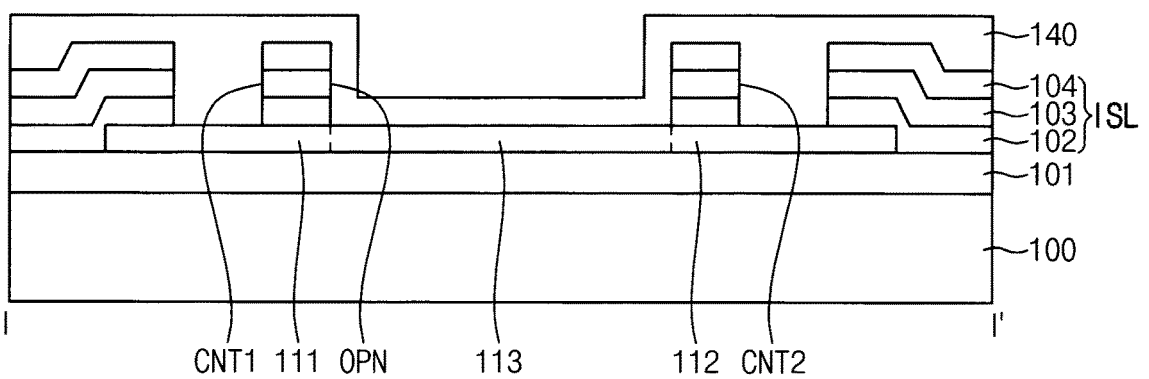

Referring to FIG. 10, a conductive layer 140 may be formed or disposed on the insulation layer ISL. The conductive layer 140 may fill the first contact hole CNT1, the second contact hole CNT2, and the opening OPN. Accordingly, the conductive layer 140 may contact the first region 111, the second region 112, and the third region 113 of the active pattern 110 through the first contact hole CNT1, the second contact hole CNT2, and the opening OPN, respectively.

Figure 11:
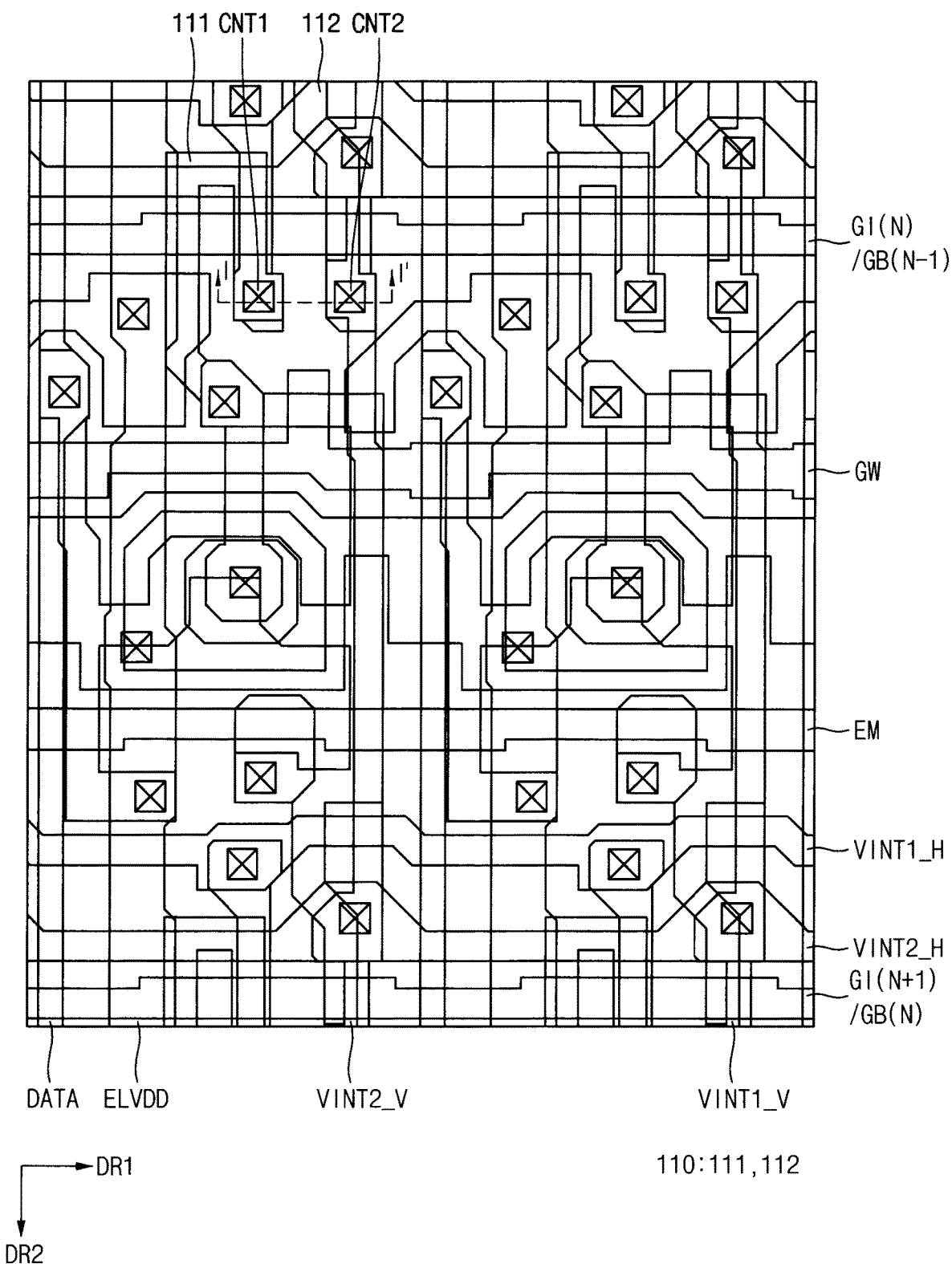
Figure 12:
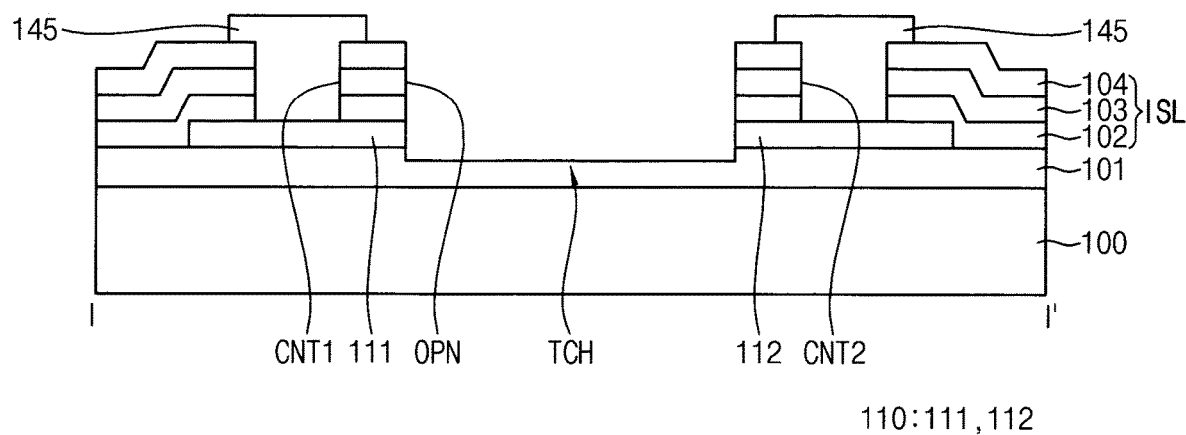

Referring to FIGS. 11 and 12, the third conductive pattern 145 may be formed or provided by patterning the conductive layer 140, and the third region 113 of the active pattern 110 may be removed.

In order to form the third conductive pattern 145, a portion of the conductive layer 140 filling the opening OPN of the insulation layer ISL may be etched using an etching material. Accordingly, the portion of the conductive layer 140 filling the opening OPN of the insulation layer ISL may be removed to expose the third region 113 of the active pattern 110.

In the process of forming the third conductive pattern 145, the third region 113 of the active pattern 110 may be etched using the etching material. Accordingly, the third region 113 of the active pattern 110 may be removed so that the first region 111 and the second region 112 of the active pattern 110 may be physically separated from each other. In this case, a side surface of the first region 111 and a side surface of the second region 112 may be exposed. Further, a portion of the buffer layer 101 overlapping the third region 113 of the active pattern 110 may be exposed. Accordingly, at a same time or a substantially same time, the third conductive pattern 145 may be formed or provided and the third region 113 of the active pattern 110 may be removed.

In an embodiment, in the process of removing the third region 113 of the active pattern 110, a portion of the buffer layer 101 overlapping the third region 113 of the active pattern 110 may be partially etched by the etching material. Accordingly, a trench TCH may be defined in the portion of the buffer layer 101 overlapping the third region 113 of the active pattern 110. Although it is not illustrated in FIG. 12, a portion of the insulation layer ISL exposed by patterning of the conductive layer 140 may be partially etched in the process of etching the third region 113 of the active pattern 110 and partially etching the portion of the buffer layer 101.

Figure 13:
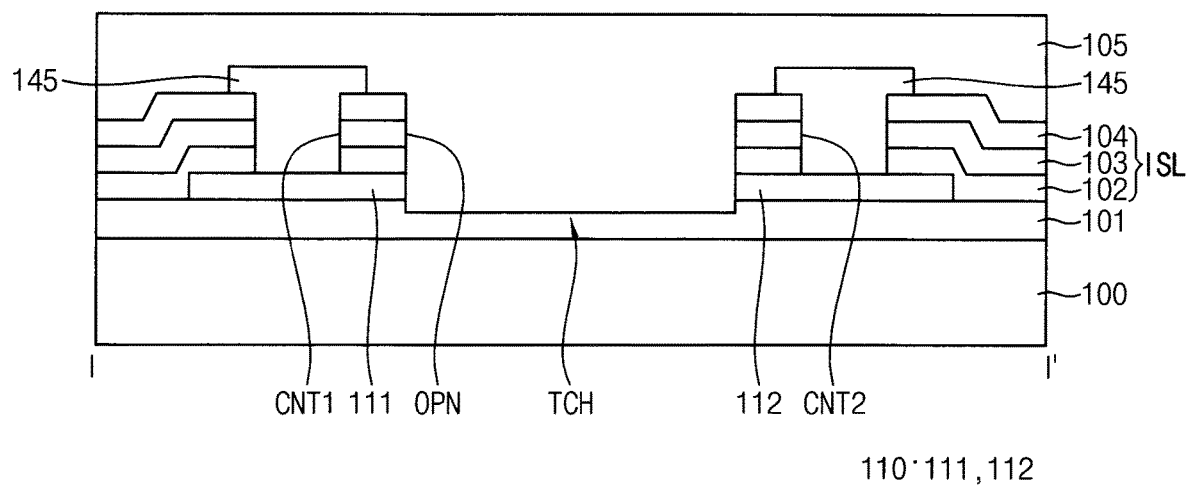

Referring to FIG. 13, a planarization layer 105 may be formed or disposed on the third conductive pattern 145.

In an embodiment, the planarization layer 105 may contact the side surface of the first region 111 and the side surface of the second region 112. The first region 111 and the second region 112 of the active pattern 110 may be spaced apart from each other, the opening OPN of the insulation layer ISL may overlap a portion between the first region 111 and the second region 112, and the third region 113 of the active pattern 110 may be removed, so that the planarization layer 105 may contact the side surface of the first region 111 and the side surface of the second region 112.

In an embodiment, the planarization layer 105 may contact the buffer layer 101. The planarization layer 105 may contact the trench TCH of the buffer layer 101 through the opening OPN of the insulation layer ISL and a portion between the first region 111 and the second region 112 of the active pattern 110.

In a method of manufacturing a display device according to a comparative example, the third region may not be formed or defined between the first region and the second region of the active pattern. In this case, as the first region and the second region of the active pattern are separated from each other in the process of forming the active pattern and the insulation layer, the first region and the second region of the active pattern may be vulnerable to static electricity introduced from the outside.

However, in the method of manufacturing the display device 1000 in the embodiment, the third region 113 may be formed or disposed between the first region 111 and the second region 112 of the active pattern 110. In this case, the first region 111 and the second region 112 of the active pattern 110 may be physically connected through the third region 113 in the process of forming the active pattern 110 and the insulation layer ISL, so that the active pattern 110 may be robust against static electricity introduced from the outside. Further, at a same time or a substantially same time, the third conductive pattern 145 may be formed or provided and the third region 113 of the active pattern 110 may be removed, so that each of the first region 111 and the second region 112 may be electrically connected to other elements of the display device 1000 through the third conductive pattern 145, and the first region 111 and the second region 112 of the active pattern 110 may be robust against the static electricity introduced from the outside.

Hereinafter, a display device in an embodiment will be described with reference to FIGS. 14 and 15.

Figure 14:
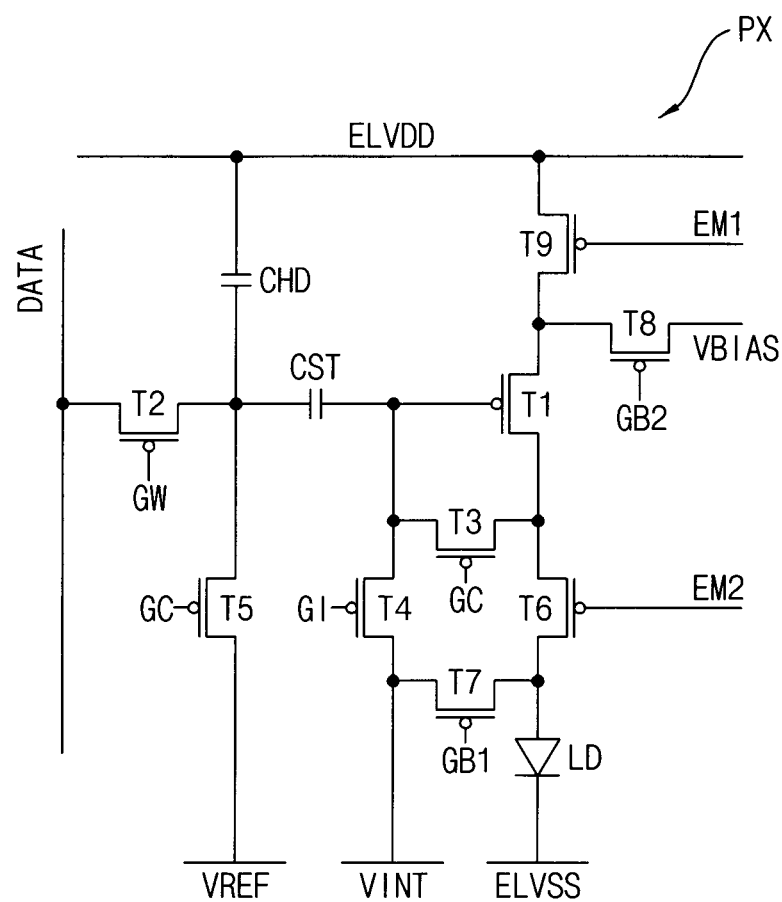
FIG. 14 is a circuit diagram illustrating a pixel.

FIG. 14 is a circuit diagram illustrating an embodiment of a pixel. In an embodiment, FIG. 14 may illustrate another embodiment of the pixel PX of the display device 1000 in FIG. 1, for example.

Referring to FIG. 14, the pixel PX may include a plurality of transistors T1, T2, T3, T4, T5, T6, T7, T8, and T9, a storage capacitor CST, a hold capacitor CHD, and a light emitting diode LD. The transistors T1, T2, T3, T4, T5, T6, T7, T8, and T9 may include a first transistor T1, a second transistor T2, a third transistor T3, a fourth transistor T4, a fifth transistor T5, a sixth transistor T6, a seventh transistor T7, an eighth transistor T8, and a ninth transistor T9.

The first transistor T1 may be electrically connected between a first power voltage line ELVDD and an anode electrode of the light emitting diode LD, and a gate electrode of the first transistor T1 may be connected to a first electrode of the storage capacitor CST. The first transistor T1 may provide a driving current corresponding to a data signal provided by the data line DATA to the light emitting diode LD. In other words, the first transistor T1 may be a driving transistor.

The second transistor T2 may be connected between the data line DATA and a second electrode of the storage capacitor CST, and may transmit the data signal to the storage capacitor CST in response to a scan signal provided by a scan line GW. In other words, the second transistor T2 may be a switching transistor.

The third transistor T3 may be connected between the gate electrode of the first transistor T1 and a second electrode of the first transistor T1, and may diode-connect the first transistor T1 in response to a compensation control signal provided by a compensation control line GC to compensate a threshold voltage of the first transistor T1. In other words, the third transistor T3 may be a compensation transistor.

The storage capacitor CST may be connected between the gate electrode of the first transistor T1 and a second electrode of the second transistor T2. The storage capacitor CST may maintain a voltage between the gate electrode of the first transistor T1 and the second electrode of the second transistor T2.

The fourth transistor T4 may be connected between an initialization voltage line VINT and the first electrode of the storage capacitor CST, and may provide an initialization voltage provided by the initialization voltage line VINT to the gate electrode of the first transistor T1 in response to a first initialization control signal provided by a first initialization control line GI. In other words, the fourth transistor T4 may be a driving initialization transistor.

The fifth transistor T5 may be connected between a reference voltage line VREF and the second electrode of the storage capacitor CST, and may provide a reference voltage provided by the reference voltage line VREF to the second electrode of the storage capacitor CST in response to the compensation control signal provided by a compensation control line GC. In other words, the fifth transistor T5 may be a reference transistor.

The ninth transistor T9 may be connected between the first power voltage line ELVDD and a first electrode of the first transistor T1, and the sixth transistor T6 may be connected between the second electrode of the first transistor T1 and the anode electrode of the light emitting diode LD. The ninth transistor T9 and the sixth transistor T6 may provide the driving current to the anode electrode of the light emitting diode LD in response to a first emission control signal provided by a first emission control line EM1 and a second emission control signal provided by a second emission control line EM2, respectively. In other words, each of the ninth transistor T9 and the sixth transistor T6 may be an emission control transistor. In an embodiment, the first emission control signal and the second emission control signal may have the same signal waveform or the substantially same signal waveform as each other, and may have different signal timings from each other.

The seventh transistor T7 may be connected between the initialization voltage line VINT and the anode electrode of the light emitting diode LD, and may provide the initialization voltage to the anode electrode of the light emitting diode LD in response to a second initialization control signal provided by a second initialization control line GB1. In other words, the seventh transistor T7 may be a diode initialization transistor.

The eighth transistor T8 may be connected between a bias voltage line VBIAS and the first electrode of the first transistor T1, and may provide a bias voltage provided by the bias voltage line VBIAS to the first electrode of the first transistor T1 in response to a third initialization control signal provided by a third initialization control line GB2. In an embodiment, the third initialization control signal may be the same as the second initialization control signal.

In an embodiment, a first electrode and a second electrode of each of the transistors T1, T2, T3, T4, T5, T6, T7, T8, and T9 may be a source electrode and a drain electrode, respectively. However, the invention is not limited thereto, and the first electrode and the second electrode of each of the transistors T1, T2, T3, T4, T5, T6, T7, T8, and T9 may be the drain electrode and the source electrode, respectively.

The hold capacitor CHD may be connected between the first power voltage line ELVDD and the second electrode of the storage capacitor CST. The hold capacitor CHD may maintain a voltage between the first power voltage line ELVDD and the second electrode of the storage capacitor CST.

The light emitting diode LD may be connected between a second electrode of the sixth transistor T6 and a second power voltage line ELVSS. The light emitting diode LD may emit light based on the driving current.

In the illustrated embodiment, the scan line GW providing the scan signal for controlling the second transistor T2 and the compensation control line GC providing the compensation control signal for controlling the third transistor T3 may be separated, so that a time for compensating the threshold voltage of the first transistor T1 by the third transistor T3 in a high frequency mode may be sufficiently secured. Accordingly, the pixel PX may be driven as a variable frequency mode including a low frequency mode and the high frequency mode.

Figure 15:
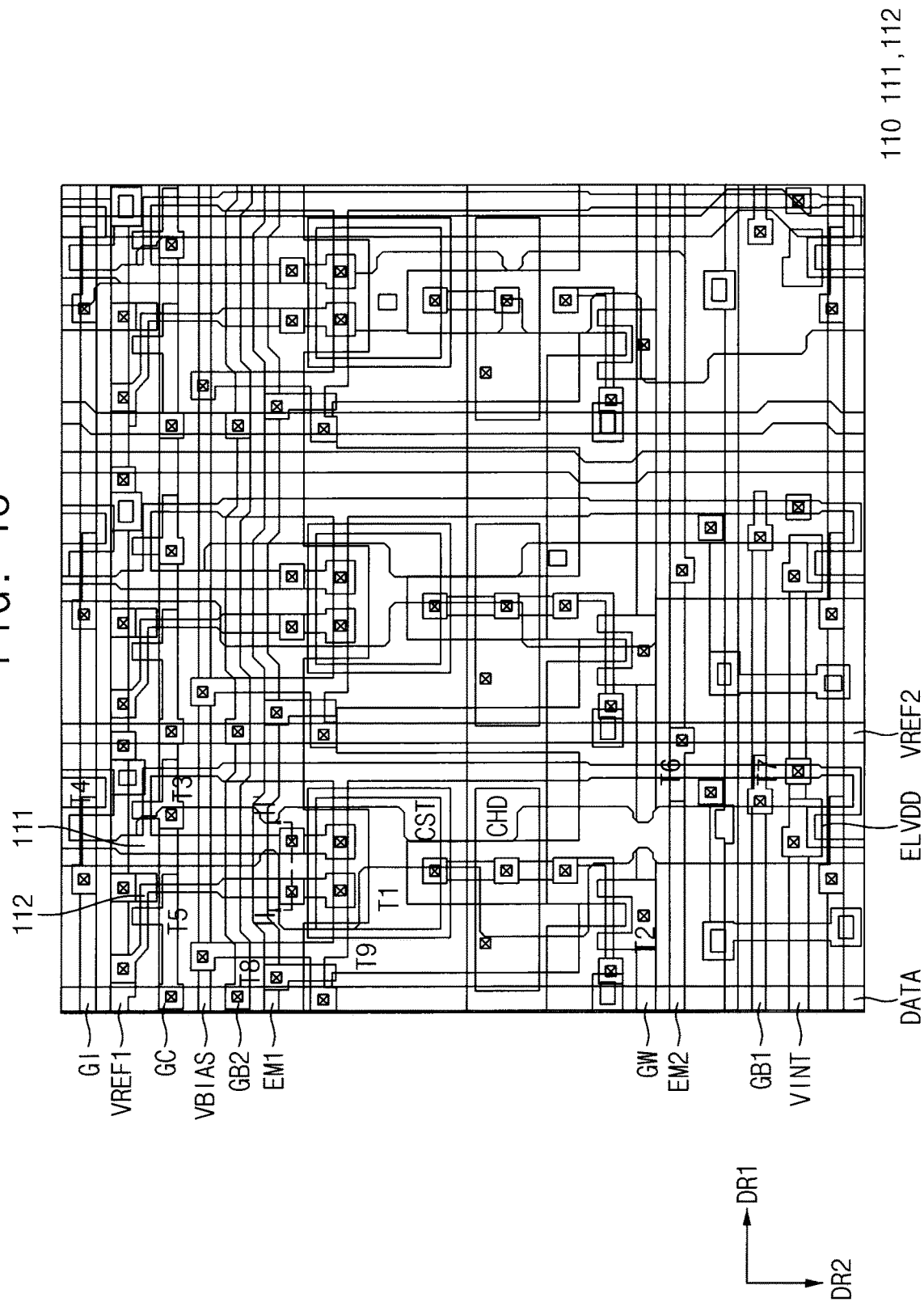
FIG. 15 is a plan view illustrating the pixel in FIG. 14.
Figure 16:
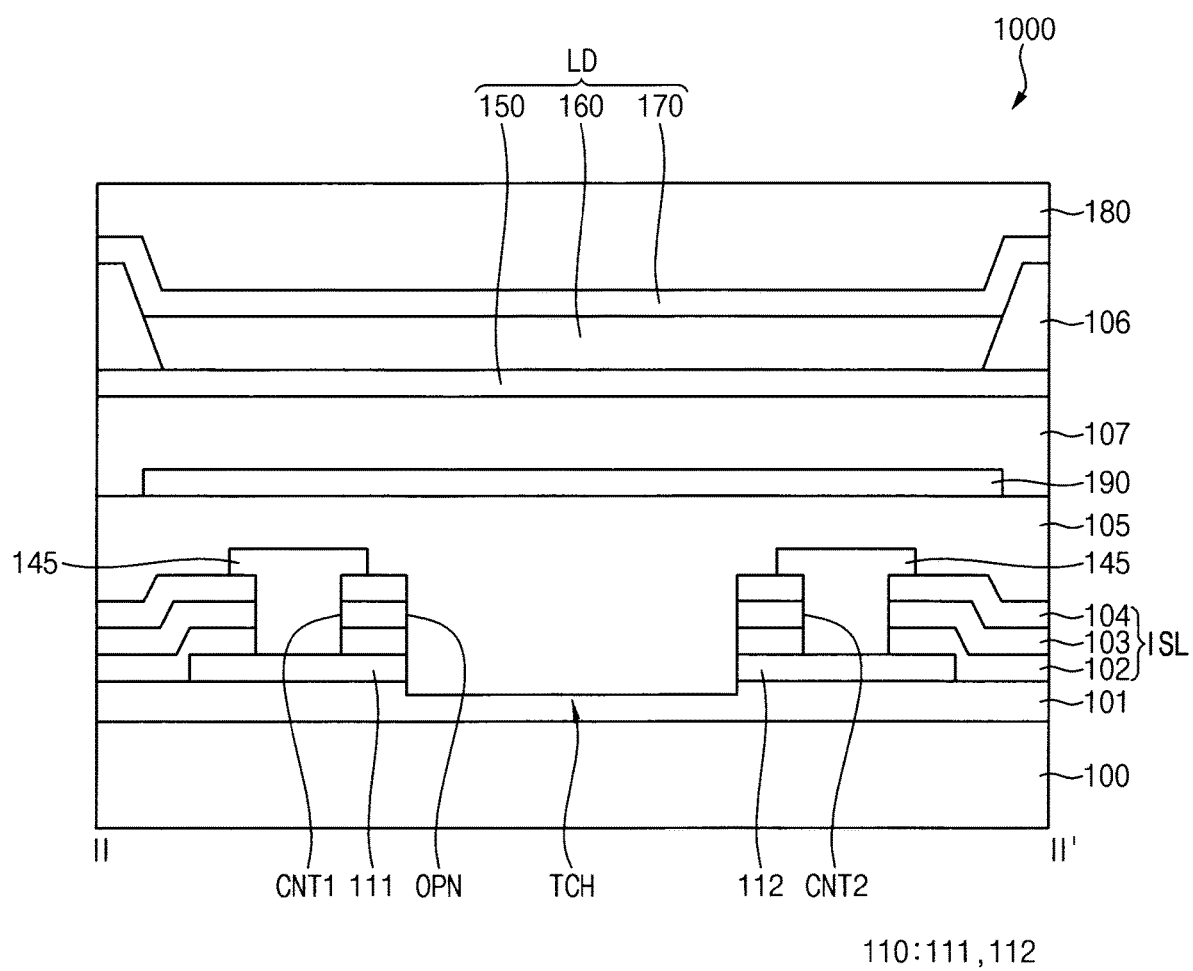
FIG. 16 is a cross-sectional view illustrating a display device taken along line II-IF in FIG. 15.

FIG. 15 is a plan view illustrating the pixel PX in FIG. 14. FIG. 16 is a cross-sectional view illustrating the display device 1000 taken along line II-IF in FIG. 15.

Referring to FIGS. 14, 15, and 16, the display device 1000 may include a substrate 100, a buffer layer 101, an active pattern 110, a gate insulation layer 102, a first conductive pattern, a first insulation interlayer 103, a second conductive pattern, a second insulation interlayer 104, a third conductive pattern 145, a first planarization layer 105, a fourth conductive pattern 190, a second planarization layer 107, a first electrode 150, a pixel defining layer 106, an emission layer 160, a second electrode 170, and an encapsulation layer 180. Descriptions on elements of the display device 1000 described with reference to FIGS. 14, 15, and 16, which are the same as or substantially the same as those of the display device 1000 described with reference to FIGS. 2, 3, and 4, will not be repeated.

In an embodiment, the first region 111 of the active pattern 110 may be a drain electrode of the fourth transistor T4, and the second region 112 of the active pattern 110 may be a drain electrode of the fifth transistor T5. However, the invention is not limited thereto, and in another embodiment, the first region 111 of the active pattern 110 may be a source electrode of the fourth transistor T4, and the second region 112 of the active pattern 110 may be a source electrode of the fifth transistor T5.

The first conductive pattern may include first to ninth gate electrodes and a first hold electrode. The active pattern 110 may form the first to ninth transistors T1, T2, T3, T4, T5, T6, T7, T8, and T9 together with the first to ninth gate electrodes.

The second conductive pattern may include a storage electrode and a second hold electrode. The storage electrode may overlap the first gate electrode, and may form the storage capacitor CST together with the first gate electrode. In an embodiment, the first gate electrode and the storage electrode may be the first electrode and the second electrode of the storage capacitor CST, respectively, for example. The second hold electrode may overlap the first hold electrode, and may form the hold capacitor CHD together with the first hold electrode.

The third conductive pattern 145 may include the scan line GW, the compensation control line GC, the first initialization control line GI, the initialization voltage line VINT, a horizontal reference voltage line VREF1, the first emission control line EM1, the second emission control line EM2, the second initialization control line GB1, the third initialization control line GB2, and the bias voltage line VBIAS.

The scan line GW may extend in the first direction DR1. The scan line GW may be electrically connected to the second gate electrode through a contact hole defined in the second insulation interlayer 104 and the first insulation interlayer 103.

The compensation control line GC may extend in the first direction DR1. The compensation control line GC may be electrically connected to the third and fifth gate electrodes through contact holes defined in the second insulation interlayer 104 and the first insulation interlayer 103.

The first initialization control line GI may extend in the first direction DR1. The first initialization control line GI may be electrically connected to the fourth gate electrode through a contact hole defined in the second insulation interlayer 104 and the first insulation interlayer 103.

The initialization voltage line VINT may extend in the first direction DR1. The initialization voltage line VINT may be electrically connected to the active pattern 110 through a contact hole defined in the second insulation interlayer 104, the first insulation interlayer 103, and the gate insulation layer 102.

The horizontal reference voltage line VREF1 may extend in the first direction DR1. The horizontal reference voltage line VREF1 may be electrically connected to the active pattern 110 through a contact hole defined in the second insulation interlayer 104, the first insulation interlayer 103, and the gate insulation layer 102.

The first emission control line EM1 may extend in the first direction DR1. The first emission control line EM1 may be electrically connected to the ninth gate electrode through a contact hole defined in the second insulation interlayer 104 and the first insulation interlayer 103.

The second emission control line EM2 may extend in the first direction DR1. The second emission control line EM2 may be electrically connected to the sixth gate electrode through a contact hole defined in the second insulation interlayer 104 and the first insulation interlayer 103.

The second initialization control line GB1 may extend in the first direction DR1. The second initialization control line GB1 may be electrically connected to the seventh gate electrode through a contact hole defined in the second insulation interlayer 104 and the first insulation interlayer 103.

The third initialization control line GB2 may extend in the first direction DR1. The third initialization control line GB2 may be electrically connected to the eighth gate electrode through a contact hole defined in the second insulation interlayer 104 and the first insulation interlayer 103.

The bias voltage line VBIAS may extend in the first direction DR1. The bias voltage line VBIAS may be electrically connected to the active pattern 110 through a contact hole defined in the second insulation interlayer 104, the first insulation interlayer 103, and the gate insulation layer 102.

The third conductive pattern 145 may contact the first region 111 and the second region 112 through the first contact hole CNT1 and the second contact hole CNT2, respectively. In this case, each of the first region 111 and the second region 112 of the active pattern 110 may be electrically connected to other elements of the display device 1000. In an embodiment, the first region 111 of the active pattern 110 may be electrically connected to the initialization voltage line VINT, and the second region 112 of the active pattern 110 may be electrically connected to the horizontal reference voltage line VREF1.

The fourth conductive pattern 190 may be disposed on the first planarization layer 105. The fourth conductive pattern 190 may include the data line DATA, the first power voltage line ELVDD, and a vertical reference voltage line VREF2. In an embodiment, the fourth conductive pattern 190 may include a metal, an alloy, a metal nitride, a conductive metal oxide, a transparent conductive material, or the like.

The data line DATA may extend in the second direction DR2. The data line DATA may be electrically connected to the active pattern 110 through a contact hole defined in the first planarization layer 105, the second insulation interlayer 104, the first insulation interlayer 103, and the gate insulation layer 102.

The first power voltage line ELVDD may extend in the second direction DR2. The first power voltage line ELVDD may be electrically connected to the third conductive pattern 145 through a contact hole defined in the first planarization layer 105.

The vertical reference voltage line VREF2 may extend in the second direction DR2. The vertical reference voltage line VREF2 may be electrically connected to the horizontal reference voltage line VREF1 through a contact hole defined in the first planarization layer 105. The horizontal reference voltage line VREF1 and the vertical reference voltage line VREF2 may form the reference voltage line VREF.

The second planarization layer 107 may be disposed between the fourth conductive pattern 190 and the first electrode 150. The second planarization layer 107 may sufficiently cover the fourth conductive pattern 190 on the first planarization layer 105, and may have a flat upper surface or a substantially flat upper surface without generating a step around the fourth conductive pattern 190. In an embodiment, the second planarization layer 107 may include or consist of an organic insulation material such as a photoresist, an acrylic resin, a polyimide resin, a polyamide resin, a siloxane-based resin, or the like.

In the illustrated embodiment, with reference to FIG. 15, the first region 111 of the active pattern 110 may be the drain electrode of the fourth transistor T4, and the second region 112 of the active pattern 110 may be the drain electrode of the transistor T5. However, the invention is not limited thereto. In another embodiment, the first region 111 of the active pattern 110 may be a drain electrode of the first transistor T1, and the second region 112 of the active pattern 110 may be a drain electrode of the second transistor T2.

The display device in the embodiments may be applied to a display device included in a computer, a notebook, a mobile phone, a smartphone, a smart pad, a portable media player ("PMP"), a personal digital assistance ("PDA"), an MP3 player, or the like.

Although the display devices and the methods of manufacturing the display devices in the embodiments have been described with reference to the drawings, the illustrated embodiments are examples, and may be modified and changed by a person having ordinary knowledge in the relevant technical field without departing from the technical spirit of the invention.

What is claimed is:

1. A method of manufacturing a display device, the method comprising:
   forming an active pattern on a substrate, the active pattern including a first region, a second region spaced apart from the first region, and a third region disposed between the first region and the second region;
   forming an insulation layer on the active pattern;
   forming a first contact hole exposing a portion of the first region, a second contact hole exposing a portion of the second region, and an opening exposing the third region in the insulation layer;
   forming a conductive layer filling the first and second contact holes and the opening on the insulation layer;
   etching a portion of the conductive layer filling the opening to form a conductive pattern filling the first and second contact holes while at the same time removing the third region; and
   forming a planarization layer on the conductive pattern.

2. The method of claim 1, wherein the planarization layer contacts a surface of the first region and a surface of the second region which face each other.

3. The method of claim 1, further comprising:
   forming a buffer layer on the substrate before forming the active pattern.

4. The method of claim 3, wherein the planarization layer contacts the buffer layer.

5. The method of claim 3, wherein the etching the portion of the conductive layer filling the opening includes partially etching a portion of the buffer layer overlapping the third region.

6. The method of claim 1, wherein the first contact hole, the second contact hole, and the opening are formed at a substantially same time.

7. The method of claim 1, wherein the first region and the second region are physically separated from each other after the etching the portion of the conductive layer filling the opening.

8. The method of claim 1, wherein the insulation layer includes a gate insulation layer, a first insulation interlayer, and a second insulation interlayer that are sequentially stacked on the active pattern.

* * * * *